(12) United States Patent
Kim et al.

(10) Patent No.: US 8,890,184 B2
(45) Date of Patent: Nov. 18, 2014

(54) NANOSTRUCTURED LIGHT-EMITTING DEVICE

(75) Inventors: Joo-sung Kim, Seongnam-si (KR); Taek Kim, Seongnam-si (KR); Moon-seung Yang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/370,996

(22) Filed: Feb. 10, 2012

(65) Prior Publication Data

US 2013/0015477 A1 Jan. 17, 2013

(30) Foreign Application Priority Data

Jul. 12, 2011 (KR) .......................... 10-2011-0068978

(51) Int. Cl.

| | |
|---|---|
| *H01L 33/00* | (2010.01) |
| *H01L 33/24* | (2010.01) |
| *B82Y 30/00* | (2011.01) |
| *B82Y 40/00* | (2011.01) |
| *B82Y 20/00* | (2011.01) |
| *H01L 33/32* | (2010.01) |
| *H01L 33/08* | (2010.01) |

(52) U.S. Cl.
CPC .................. *H01L 33/24* (2013.01); *B82Y 30/00* (2013.01); *B82Y 40/00* (2013.01); *B82Y 20/00* (2013.01); *H01L 33/32* (2013.01); *H01L 33/08* (2013.01)
USPC ........ 257/95; 257/94; 257/103; 257/E33.005; 257/E33.006; 438/39; 438/41

(58) Field of Classification Search
USPC ...................... 257/13, 98, E33.005, E33.028, 257/E33.033, 94, 103, E33.006; 438/39, 41
See application file for complete search history.

(56) References Cited

U.S. PATENT DOCUMENTS

| | | | |
|---|---|---|---|
| 6,320,209 B1 * | 11/2001 | Hata et al. ..................... | 257/190 |
| 7,576,363 B2 | 8/2009 | Uemura et al. | |

(Continued)

FOREIGN PATENT DOCUMENTS

| | | |
|---|---|---|
| JP | 200321834 A | 7/2003 |
| JP | 2003218393 A | 7/2003 |

(Continued)

OTHER PUBLICATIONS

Neubert, et al.; "Semipolar GaN/GaInN LEDs with more than 1 mW optical output power" Journal of Crystal Growth, Dec. 2006, vol. 298, pp. 706-709.

Wunderer, et al.; "Bright semipolar GaInN/GaN blue light emitting diode on side facets of selectively grown GaN stripes", American Institute of Physics, 2006, vol. 89, pp. 041121-1 to 041121-3.

(Continued)

*Primary Examiner* — Cheung Lee
*Assistant Examiner* — Jeremy Joy
(74) *Attorney, Agent, or Firm* — Sughrue Mion, PLLC

(57) ABSTRACT

A nanostructured light-emitting device including: a first type semiconductor layer; a plurality of nanostructures each including a first type semiconductor nano-core grown in a three-dimensional (3D) shape on the first type semiconductor layer, an active layer formed to surround a surface of the first type semiconductor nano-core, and a second type semiconductor layer formed to surround a surface of the active layer and including indium (In); and at least one flat structure layer including a flat-active layer and a flat-second type semiconductor layer that are sequentially formed on the first type semiconductor layer parallel to the first type semiconductor layer.

12 Claims, 9 Drawing Sheets

(56) References Cited

U.S. PATENT DOCUMENTS

| | | | |
|---|---|---|---|
| 2003/0168666 A1* | 9/2003 | Okuyama et al. | 257/80 |
| 2003/0180977 A1* | 9/2003 | Suzuki et al. | 438/22 |
| 2004/0129929 A1* | 7/2004 | Okuyama et al. | 257/10 |
| 2007/0085087 A1* | 4/2007 | Okuyama et al. | 257/79 |
| 2009/0032799 A1* | 2/2009 | Pan | 257/13 |
| 2009/0159907 A1* | 6/2009 | Wang | 257/94 |
| 2011/0291072 A1* | 12/2011 | Kim | 257/13 |
| 2012/0153252 A1* | 6/2012 | Kim et al. | 257/13 |

FOREIGN PATENT DOCUMENTS

| | | |
|---|---|---|
| KR | 1020060050820 A | 5/2006 |
| KR | 100857410 B1 | 9/2008 |
| KR | 1020090010284 A | 1/2009 |
| KR | 1020090017945 A | 2/2009 |
| KR | 10-2011-0131801 A | 12/2011 |
| KR | 10-2011-0132135 A | 12/2011 |

OTHER PUBLICATIONS

Ren, et al.; "Anisotropic Mg incorporation in GaN growth on nonplanar templates", American Institute of Physics, 2005, vol. 86, pp. 121901-1 to 121901-3.

Dupuis, Russell D., et al., "InGaN MQW Green LEDs Using p-InGaN and p-InGaN/p-GaN Superlattices as p-Type Layers," Center for Compound Semiconductors, School of Electrical and Computer Engineering, Georgia Institute of Technology, Proc. of SPIE vol. 6894, 2008, pp. 68941D1-8.

Chang, S.J., et al. "Nitride-Based LEDs With p-InGaN Capping Layer," IEEE Transactions on Electron Devices, vol. 50, No. 12, Dec. 2003, pp. 2567-2570.

Dupuis, Russell D., et al., "InGaN MQW Green LEDs Using p-InGaN and p-InGaN/p-GaN Superlattices as p-Type Layers," Center for Compound Semiconductors, School of Electrical and Computer Engineering, Georgia Institute of Technology, Proc. of SPIE vol. 6894, Feb. 15, 2008, pp. 68941D1-8.

* cited by examiner

NANOSTRUCTURED LIGHT-EMITTING DEVICE

CROSS-REFERENCE TO RELATED APPLICATIONS

This application claims priority from Korean Patent Application No. 10-2011-0068978, filed on Jul. 12, 2011 in the Korean Intellectual Property Office, the disclosure of which is incorporated herein in its entirety by reference.

BACKGROUND

1. Field

The present disclosure relates to nanostructured light-emitting devices.

2. Description of the Related Art

Semiconductor light-emitting devices are light sources that have high efficiency and are eco-friendly. Semiconductor light-emitting devices are used in a variety of fields, such as displays, optical communication, vehicles, general illumination, and the like. The range of applications in which semiconductor light-emitting devices are used is increasing, as blue light-emitting devices and ultraviolet (UV)-ray emitting devices using nitride having excellent physical and chemical characteristics have recently emerged. The further emergence of white light or other single-color light emitting devices, which use blue light-emitting devices or UV-ray emitting devices and a fluorescent material, has also contributed to the increase in the range of applications in which semiconductor light-emitting devices are used.

The basic operating principle behind semiconductor light-emitting devices is the emission of light achieved through the combination of electrons and holes injected into an active layer. However, as a general matter, many crystal defects exist in nitride-based compound semiconductor crystals. When electrons and holes combine through the crystal defects, the semiconductor light-emitting devices emit thermal energy, instead of light energy. Reducing such non-emission re-combination is a significant factor in improving the luminous efficiency of semiconductor light-emitting devices.

The crystal defects that cause the non-emission re-combination discussed above are generated as a result of a mismatch between the lattice constants or the thermal expansion coefficients of a growth substrate and a compound semiconductor. In this regard, the present inventors have studied a technology for forming a nano-sized light-emitting structure. With respect to one-dimensional growth, nanostructures are less affected by mismatched lattice constants or differences between the thermal expansion coefficients of a growth substrate and a compound semiconductor than thin-layers. Thus, nanostructures are known to grow easily over a large area of different types of substrates.

SUMMARY

Exemplary embodiments light-emitting devices having nanostructures in which a p-type semiconductor layer may be more uniformly formed.

According to an aspect of an embodiment, there is provided a light-emitting device including: a first type semiconductor layer; a plurality of nanostructures each including a first type semiconductor nano-core grown in a three-dimensional (3D) shape on the first type semiconductor layer, an active layer formed to surround a surface of the first type semiconductor nano-core, and a second type semiconductor layer formed to surround a surface of the active layer and including indium (In); and at least one flat structure layer including a flat-active layer and a flat-second type semiconductor layer that are sequentially formed on the first type semiconductor layer parallel to the first type semiconductor layer.

The 3D shape may include one of a cone shape, a pyramid shape, and a column shape.

The second type semiconductor layer may be doped with magnesium (Mg), which is an impurity.

The second type semiconductor layer may include $In_xGa_{1-x}N$ (where $0<x<1$), for example, $In_xGa_{1-x}N$ (where $0<x<0.1$).

The second type semiconductor layer may include $Al_xIn_yGa_{1-x-y}N$ (where $0<x<1$, $0<y<1$, $0<x+y<1$), for example, $Al_xIn_yGa_{1-x-y}N$ (where $0<x<1$, $0<y<0.1$, $0<x+y<1$).

The light-emitting device may further include an $Al_xIn_yGa_{1-x-y}N$ layer (where $0<x<1$, $0<y<1$, $0<x+y<1$) interposed between the active layer and the second type semiconductor layer.

The light-emitting device may further include a mask layer formed on the first type semiconductor layer and having a plurality of nano-holes formed therein, wherein the first type semiconductor nano-core of each of the plurality of nanostructures is grown through each of the plurality of nano-holes.

The plurality of nanostructures and the at least one flat structure layer may be alternately disposed. The active layers of the plurality of nanostructures and the flat-active layer of the at least one flat structure layer may be connected to one another.

The plurality of nanostructures may be divided into a plurality of groups including two or more adjacent nanostructures, and the at least one flat structure layer and the plurality of groups may be alternately disposed.

The flat-active layer of the at least one flat structure layer may be connected to the active layers of the plurality of nanostructures that are adjacent to one another with the at least one flat structure layer between the groups of nanostructures, or the flat-active layer of the at least one flat structure layer may be connected to the active layers of the plurality of nano-structures.

According to an aspect of another exemplary embodiment, there is provided a light-emitting device including: a first type semiconductor layer; and a plurality of nanostructures each including a first type semiconductor nano-core grown in a 3D shape on the first type semiconductor layer, an active layer formed to surround a surface of the first type semiconductor nano-core, and a second type semiconductor layer formed to surround a surface of the active layer and including $Al_xIn_yGa_{1-x-y}N$ (where $0<x<1$, $0<y<0.1$, $0<x+y<1$).

The 3D shape may include one of a cone shape, a pyramid shape, and a column shape.

The second type semiconductor layer may be doped with magnesium (Mg) that is an impurity.

The light-emitting device may further include an $Al_xIn_yGa_{1-x-y}N$ layer (where $0<x<1$, $0<y<1$, $0<x+y<1$) interposed between the active layer and the second type semiconductor layer.

The light-emitting device may further include a mask layer formed on the first type semiconductor layer and having a plurality of nano-holes formed therein, wherein the first type semiconductor nano-core of each of the plurality of nanostructures is grown through each of the plurality of nano-holes.

The active layers of the plurality of nanostructures may not be connected to one another.

BRIEF DESCRIPTION OF THE DRAWINGS

The above and/or other aspects will become apparent and more readily appreciated from the following description of embodiments, taken in conjunction with the accompanying drawings in which.

DETAILED DESCRIPTION

Figure 1:
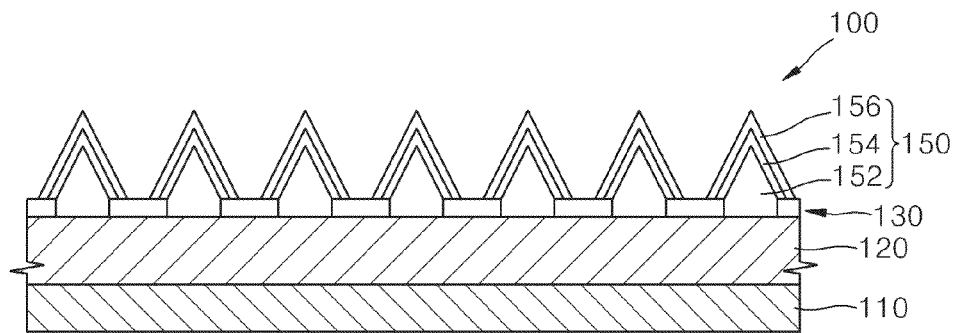
FIG. 1 is a cross-sectional view of a light-emitting device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the present description. In the drawings, the thicknesses of layers and regions may be exaggerated for clarity.

Figure 2:
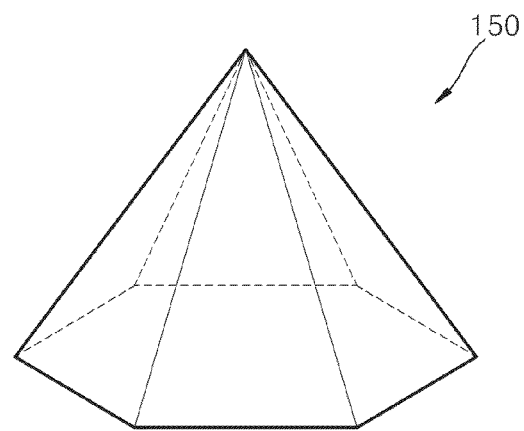
FIG. 2 is a perspective view of a shape of one of a plurality of nanostructures of the light-emitting device illustrated in FIG. 1.

FIG. 1 is a cross-sectional view of a light-emitting device 100 according to an embodiment and FIG. 2 is a perspective view of a shape of one of a plurality of nanostructures 150 of the light-emitting device 100 illustrated in FIG. 1.

Referring to FIGS. 1 and 2, the light-emitting device 100 includes a first type semiconductor layer 120 and a plurality of nanostructures 150 formed on the first type semiconductor layer 120. Each of the plurality of nanostructures 150 includes a first type semiconductor nano-core 152 that is grown in a 3D shape, an active layer 154 that is formed to surround a surface of the first type semiconductor nano-core 152, and a second type semiconductor layer 156 that is formed to surround a surface of the active layer 154 and which contains indium (In).

A more detailed structure of the light-emitting device 100 will now be described.

Substrate 110 is a growth substrate on which a semiconductor monocrystal is to be grown. The substrate 110 may be a silicon (Si) substrate, a silicon carbide (SiC) substrate, a sapphire substrate, or the like. Substrate 110 may also be formed from any material that is suitable for growth of the first type semiconductor layer 120 that is to be formed on the substrate 110. For example, Substrate 110 may also be formed from zinc oxide (ZnO), gallium arsenide (GaAs), $MgAl_2O_4$, magnesium oxide (MgO), lithium aluminum dioxide ($LiAlO_2$), lithium gallium dioxide ($LiGaO_2$), or gallium nitride (GaN). The material forming substrate 110 is not particularly limited, so long as it is suitable for the growth of the first type semiconductor layer 120.

First type semiconductor layer 120 is formed on the substrate 110. The first type semiconductor layer 120 is a semiconductor layer that is doped with a first type impurity and may be formed of a group III-V nitride semiconductor material. For example, the first type semiconductor layer 120 may be GaN that is doped with an n-type impurity. The n-type impurity is not particularly limited, and may be Si, germanium (Ge), selenium (Se), tellurium (Te), or the like. The first type semiconductor layer 120 may be formed using methods known in the art, including but not limited to hydride vapor phase epitaxy (HVPE), molecular beam epitaxy (MBE), metal organic vapor phase epitaxy (MOVPE), metal organic chemical vapor deposition (MOCVD), or the like.

Although not shown, a buffer layer for epitaxial growth may be further formed between the substrate 110 and the first type semiconductor layer 120, if desired. Further, the first type semiconductor layer 120 may have a multi-layer structure.

A mask layer 130 having a plurality nano-holes formed therein may be formed on the first type semiconductor layer 110. The mask layer 130 may be formed of an insulating material including, but not limited to, silicon oxide (for example, silicon dioxide ($SiO_2$)) or silicon nitride, titanium dioxide ($TiO_2$), $Si_3N_4$, $Al_2O_3$, titanium nitride (TiN), aluminum nitride (AlN), zirconium dioxide ($ZrO_2$), titanium aluminum nitride (TiAlN), titanium silicon nitride (TiSiN), or the like. The mask layer 130 may be formed by forming a layer using an insulating material on the first type semiconductor layer 120 and etching the layer in a desired nano-hole pattern by performing a lithography process. A nano-hole may have a cross-sectional shape, including shapes including but not limited to circles, ovals, polygons, or the like. The shape of the nanostructures 150 is defined by the shape of the nano-hole. The nanostructures 150 may be formed as a hexagonal pyramid, as illustrated in FIG. 2, for example. However, the present invention is not limited thereto, and the nanostructures 150 may have other shapes, such as a polygonal or circular cone shape, a pyramid shape, and a column shape.

The first type semiconductor nano-core 152 may be formed from a semiconductor material that is doped with a first type impurity that is the same as that of the first type semiconductor layer 120, for example, n-GaN. The first type semiconductor nano-core 152 has a shape that is grown from the first type semiconductor layer 120 through the nano-hole formed in the mask layer 130. The first type semiconductor nano-core 152 has a cross-sectional shape, such as a circle, an oval, a polygon, or the like, depending on the cross-sectional shape of the nano-hole. The cross section of the first type semiconductor nano-core 152 may be constant or may be reduced along a growth direction.

The active layer 154 emits light by electron-hole re-combination. The active layer 154 may have a single quantum well or multi-quantum well structure that is formed by adjusting a band gap of the active layer 154 by periodically varying values x, y, and z in $Al_xGa_yIn_zN$. For example, a quantum well structure may be configured by forming a quantum well layer and a barrier layer as a pair in the form of InGaN/GaN, InGaN/InGaN, InGaN/AlGaN, or InGaN/InAlGaN, and band gap energy is controlled according to the indium (In) mole ratio in an InGaN layer and thus, the light-emitting wavelength band may be adjusted. In general, when the In mole ratio in the InGaN layer is changed by 1%, the light-emitting wavelength is shifted by about 5 nm. The active layer 154 is grown from the first type semiconductor nano-core 152 in a radiant shape and surrounds the surface of the first type semiconductor nano-core 152.

In FIGS. 1 and 2, the active layers 154 of the plurality of nanostructures 150 are not connected to one another. However, the present invention is not limited thereto, and in some embodiments, the active layers 154 of the plurality of nanostructures 150 may be connected to one another.

The second type semiconductor layer 156 may be formed to cover the surface of the active layer 154 and may be formed of a semiconductor material that is doped with a second type of impurity. For example, the second type semiconductor layer 156 may be formed from $In_xGa_{1-x}N$ (where 0<x<1) that is doped with a p-type impurity, and the p-type impurity may be magnesium (Mg), zinc (Zn), beryllium (Be), or the like. The use of indium (In) is proposed in order to allow the group III semiconductor material to migrate to the top part of the active layer 154 when the second type semiconductor layer 156 is formed. Thus, the band gap of the second type semiconductor layer 156 will be decreased, improving the doping effect of the p-type impurity. The content of In may be adjusted as desired to achieve the above properties. For example, In may be present as follows: $In_xGa_{1-x}N$ (where 0<x<0.1).

When the second type semiconductor layer 156 is intended to have a higher band gap, the second type semiconductor layer 156 may be formed from a semiconductor material that contains Al. The second type semiconductor layer 156 may be formed from $p-Al_xIn_yGa_{1-x-y}N$ (where 0<x<1, 0<y<1, 0<x+y<1), for example. Also in this case, the content of In may be adjusted as desired so that the second type semiconductor layer 156 may be smoothly formed on the top part of the active layer 154 and the p-type impurity may be doped into the second type semiconductor layer 156. For example, the second type semiconductor layer 156 may be formed from $p-Al_xIn_yGa_{1-x-y}N$ (where 0<x<1, 0<y<0.1, 0<x+y<1).

A light-emitting structure, such as the nanostructure 150, improves the internal quantum efficiency of the light-emitting device 100, as compared to a general light-emitting structure based on thin layer-based technology. More specifically, when the first type semiconductor nano-core 152 is grown on the first type semiconductor layer 120 in a (0001)-direction, by using the mask layer 130 having nano-holes formed therein, a lateral side of the grown first type semiconductor nano-core 152 is a (11-11)-plane or (11-22)-plane that is a semipolar plane. When the active layer 154, which has a quantum well structure, is grown on the semipolar plane, spontaneous polarization is reduced. In addition, since the size of the light-emitting structure is nano-size at which strain is alleviated, polarization caused by a piezoelectric field effect is suppressed, and a quantum confinement stark effect (QCSE) is suppressed, as in a non-polar plane. Thus, the number of crystal defects caused by an increase in the content of In may be reduced, and the content of In may be easily maintained uniform, and as such, the light extraction effect may be improved.

On the other hand, in the current embodiment, $p-In_xGa_{1-x}N$ (where 0<x<1) is used as a semiconductor material for forming the second type semiconductor layer 156 that contains In, to more uniformly form the second type semiconductor layer 156 on the surface of the active layer 154.

Generally, a p-type semiconductor layer that is grown after the active layer 154 has been formed, may not grow or may not be uniformly grown at a vertex position on the top part of the active layer 154 having the 3D structure. As a result, the amount leakage current may increase, and the doping efficiency of the p-type impurity may lower, and an electrical resistance of the light-emitting device 100 may increase.

This phenomenon is caused by lateral growth, which is the general growth type when GaN is grown using Mg as a p-type impurity (p-GaN:Mg). The p-type impurity, Mg, disturbs migration of Ga atoms and prevents Ga atoms from reaching the top part of the active layer 154 of the 3D-shaped nanostructure 150. In addition, because the growth temperature of the p-type semiconductor layer is generally higher than the growth temperature of the active layer 154, local In segregation occurs in an InGaN layer included in the active layer 154 during p-GaN growth, or phase separation occurs in In-rich InGaN and thus the internal quantum efficiency of the light-emitting device 100 is lowered.

Thus, in the current embodiment, p-InGaN, instead of p-GaN is used to prevent the non-uniform growth of the p-type semiconductor layer that is a cause of leakage current when the nanostructure 150 is formed as a 3D structure. In this case, the atomic migration of In atoms greater as compared to the atomic migration of Ga atoms in the 3D structure. That is, considering that growth does not occur at the top part, or vertex, of the active layer 154 when p-GaN (p-GaN:Mg) is formed, in which Mg is used as an impurity, because Mg disturbs the migration of Ga atoms to the top part of the active layer 154, In atoms (that are more active than the Ga atoms) are added to the p-type semiconductor layer to promote the migration of Group III atoms to the top part of the active layer 154. In addition, p-InGaN:Mg growth occurs at a lower temperature than p-GaN:Mg which increases the In incorporation rate. Thus, thermal degradation (of active layer 154 having a quantum well structure of InGaN/GaN may) resulting from the heat used to grow the p-type semiconductor layer may be prevented. In addition, it is well known that the doping efficiency of a p-type impurity into a small facet constituting a 3D structure is lower than in a general c-plane and the light-emitting device 100 has a high electrical resistance. Since p-InGaN:Mg that contains In has a lower band gap than that of p-GaN:Mg, the activation energy of Mg atoms is decreased and the doping efficiency of the p-type impurity may be improved.

Figure 3:
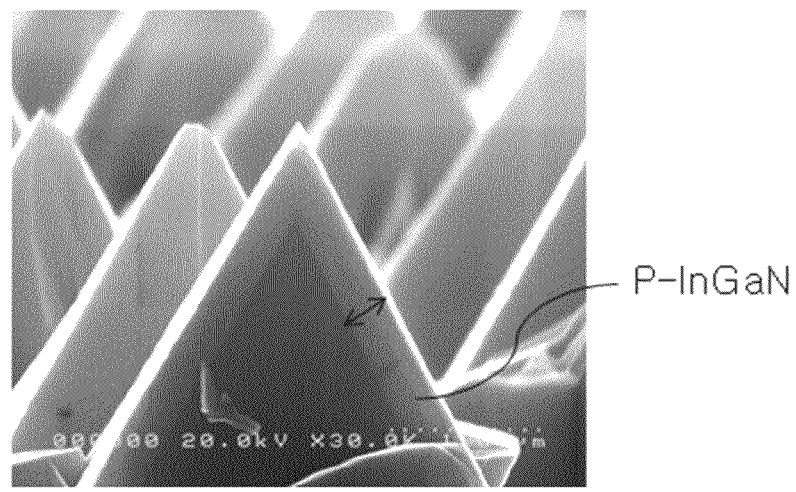
FIG. 3 is a microscopic photo showing a nanostructure formed using p-InGaN.

The present inventor has ascertained that comparatively uniform growth may be performed on a top part of a 3D structure of the p-type semiconductor layer that contains In. FIG. 3 is a microscopic photo showing a nanostructure formed using p-InGaN and FIG. 4 is a microscopic photo showing a nanostructure formed using p-GaN according to a comparative example.

Referring to FIG. 3, when the second type semiconductor layer 156 is formed as p-InGaN, p-InGaN is formed at a top part of the second type semiconductor layer 156 in a comparatively uniform thickness. On the other hand, referring to FIG. 4, when the second type semiconductor layer 156 is formed as p-GaN, the thickness of p-GaN that is formed at the top part of the second type semiconductor layer 156 is significantly small.

Figure 4:
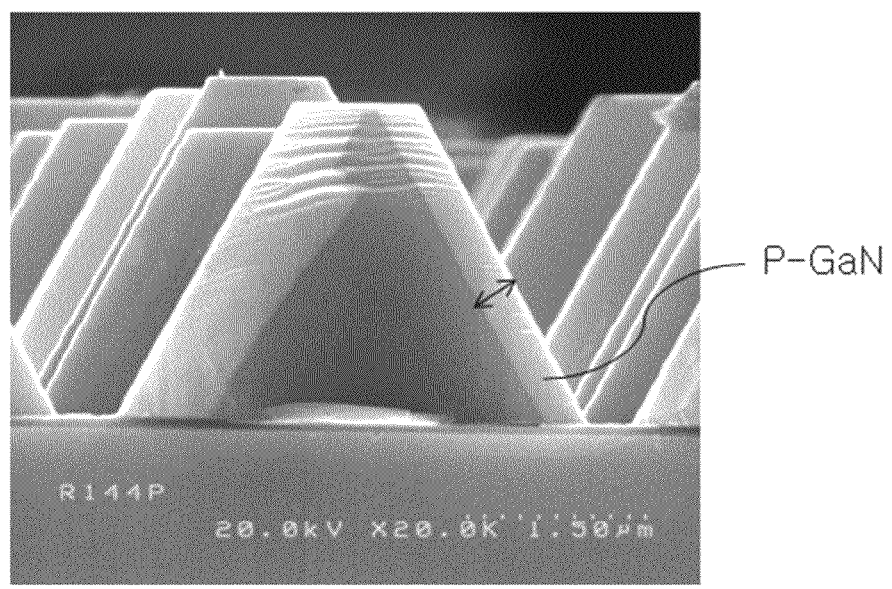
FIG. 4 is a microscopic photo showing a nanostructure formed using p-GaN according to a comparative example.
Figure 5:
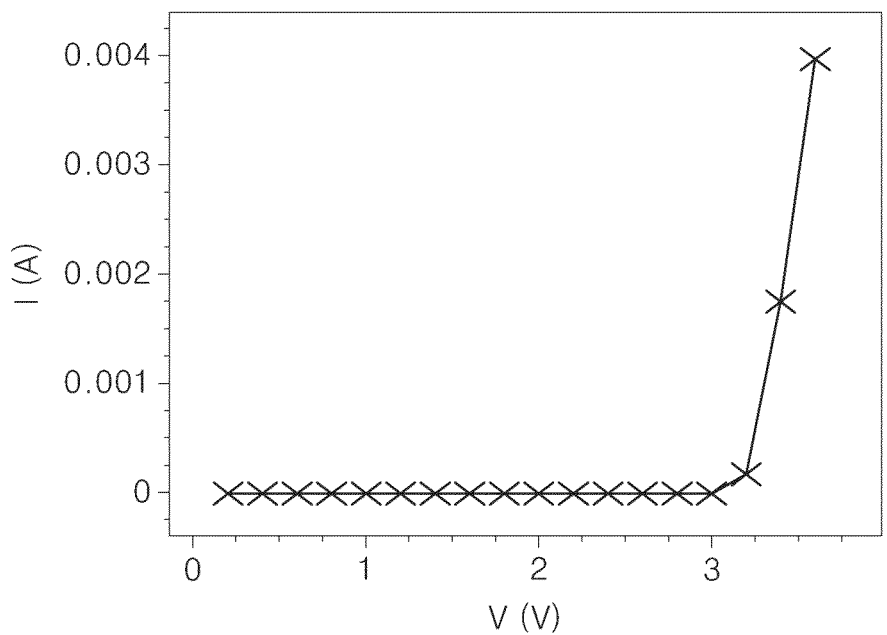
FIG. 5 is a graph showing a current-voltage (an I-V) curve of a light-emitting device manufactured to have the shape of FIG. 3.
Figure 6:
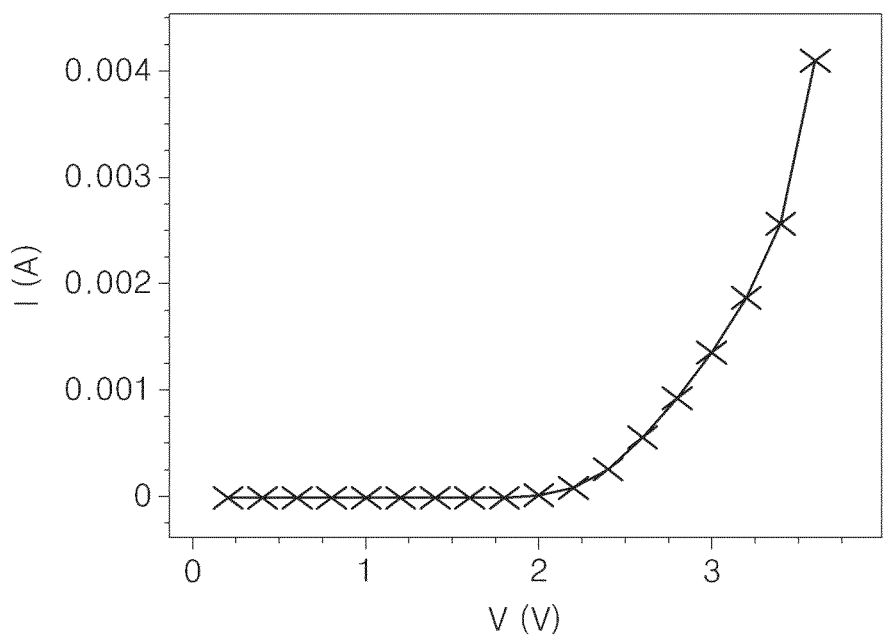
FIG. 6 is a graph showing an I-V curve of a light-emitting device manufactured to have the shape of FIG. 4.

FIG. 5 is a graph showing an I-V curve of a light-emitting device manufactured to have the shape of FIG. 3, and FIG. 6 is a graph showing an I-V curve of a light-emitting device manufactured to have the shape of FIG. 4. Referring to FIGS. 5 and 6, when p-InGaN is formed to a comparatively uniform thickness, a leakage current may be significantly decreased as compared to a case where the thickness of p-GaN that is formed at the top part of the second type semiconductor layer 156 is small.

Figure 7:
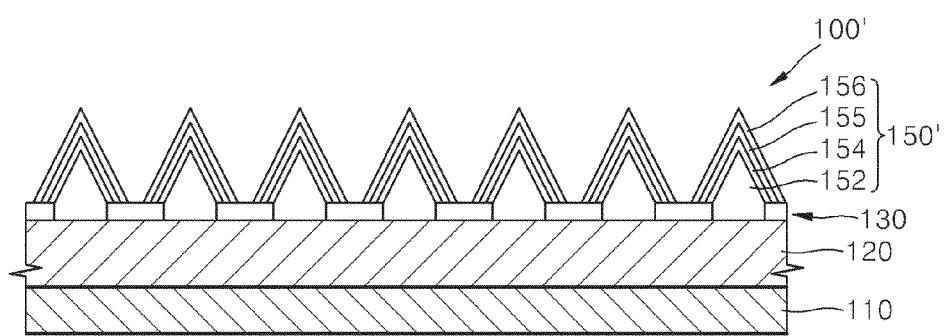
FIG. 7 is a cross-sectional view of a schematic structure of a light-emitting device according to another embodiment.

FIG. 7 is a cross-sectional view of a schematic structure of a light-emitting device 100' according to another embodiment.

The light-emitting device 100' according to this embodiment is different from the light-emitting device 100 illustrated in FIG. 1 in that the light-emitting device 100' of FIG. 7 includes a plurality of nanostructures 150' each including an $Al_xIn_yGa_{1-x-y}N$ layer 155 (where $0<x<1$, $0<y<1$, $0<x+y<1$) between the active layer 154 and the second type semiconductor layer 156. The $Al_xIn_yGa_{1-x-y}N$ (where $0<x<1$, $0<y<1$, $0<x+y<1$) layer 155 may be doped with a p-type impurity and functions as an electron blocking layer (EBL) or a current spreading layer (CSL).

Figure 8:
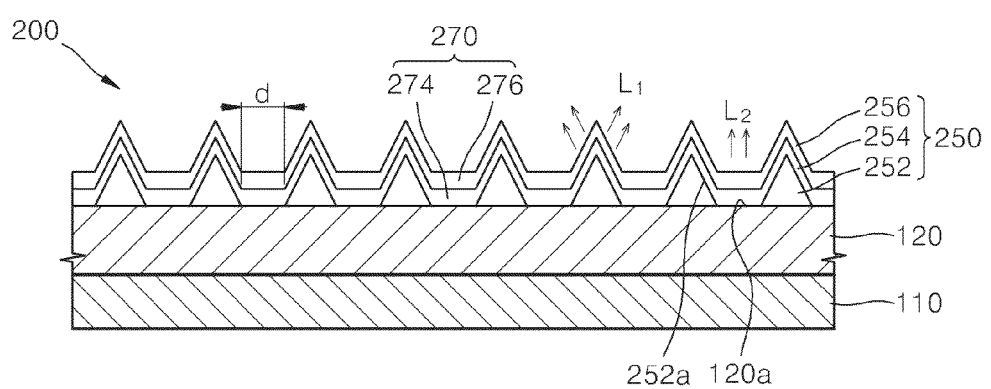
FIG. 8 is a cross-sectional view of a schematic structure of a light-emitting device according to another embodiment.

FIG. 8 is a cross-sectional view of a schematic structure of a light-emitting device 200 according to another embodiment.

The light-emitting device 200 according to this embodiment is different from the light-emitting device 100 of FIG. 1 in that the light-emitting device 200 of FIG. 8 has a structure in which multi-wavelength light, such as white light, is emitted. The light-emitting device 200 includes a plurality of nanostructures 250 each including a first type semiconductor nano-core 252, an active layer 254, and a second type semiconductor layer 256, and at least one flat structure layer 270 including a flat-active layer 274 and a flat-second type semiconductor layer 276 that are formed on the first type semiconductor layer 120 parallel thereto.

The plurality of nanostructures 250 and the flat structure layer 270 are alternately disposed. In detail, the flat structure layer 270 is disposed between two adjacent nanostructures 250, and active layers 254 of the nanostructures 250 and the flat-active layer 274 are connected to one another.

In this structure, the flat-active layer 274 is formed on a flat plane 120a that is a c-plane having polarity, and the active layer 254 is formed on an inclined plane 252a that is a semipolar plane. Thus, even when InGaN layers are grown under the same conditions, the contents of In contained in the InGaN layers are different. Thus, light $L_1$ having a relatively long wavelength is emitted from the nanostructures 250, and light $L_2$ having a relatively short wavelength is emitted from the flat structure layer 270. In addition, the amount of the light $L_2$ having a relatively short wavelength may be adjusted by adjusting a length d of the flat structure layer 270 so that the light-emitting device 200 may emit white light or other multi-wavelength light.

Figure 9:
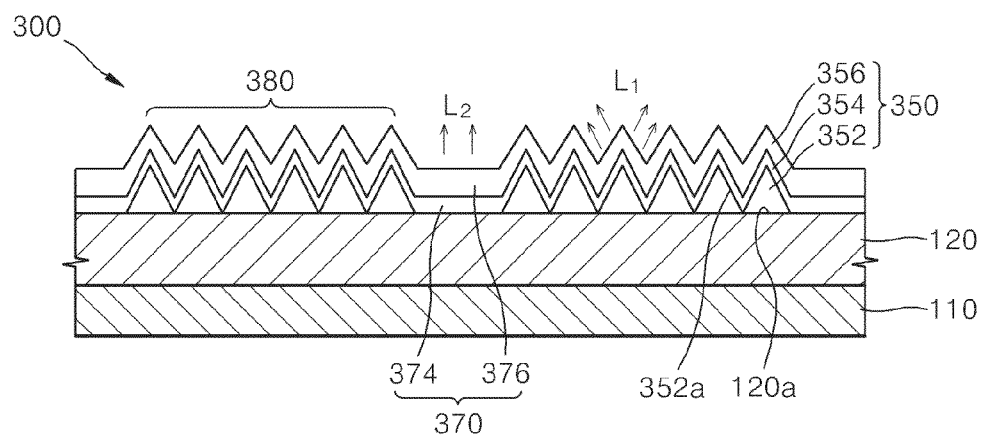
FIG. 9 is a cross-sectional view of a schematic structure of a light-emitting device according to another embodiment.

FIG. 9 is a cross-sectional view of a schematic structure of a light-emitting device 300 according to another embodiment.

Referring to FIG. 9, the light-emitting device 300 includes a plurality of nanostructures 350 each including a first type semiconductor nano-core 352, an active layer 354, and a second type semiconductor layer 356 connected to each other, and at least one flat structure layer 370 including a flat-active layer 374 and a flat-second type semiconductor layer 376 that are formed on the first type semiconductor layer 120 parallel thereto.

In the current embodiment, the plurality of nanostructures 350 are divided into a plurality of groups 380 including two or more adjacent nanostructures 350 and the flat structure layer 370 and the plurality of groups 380 are alternately disposed. Similarly, the active layer 354 is formed on an inclined plane 352a that is a semipolar plane, and the flat-active layer 374 is formed on a flat plane 120a that is a c-plane having polarity. Thus, the nanostructures 350 emit light $L_1$ having a relatively long wavelength, and the flat structure layer 370 emits light $L_2$ having a relatively short wavelength. By a combination of the light $L_1$ having a relatively long wavelength emitted from the nanostructures 350 and the light $L_2$ having a relatively short wavelength emitted from the flat structure layer 370, white light or other multi-wavelength light is emitted. The number of nanostructures 350 that constitute the groups 380 or a length of the flat structure layer 370 may be adjusted in consideration of specific wavelength values of the lights $L_1$ and $L_2$ emitted therefrom so that a desired multi-wavelength light may be emitted.

Figure 10:
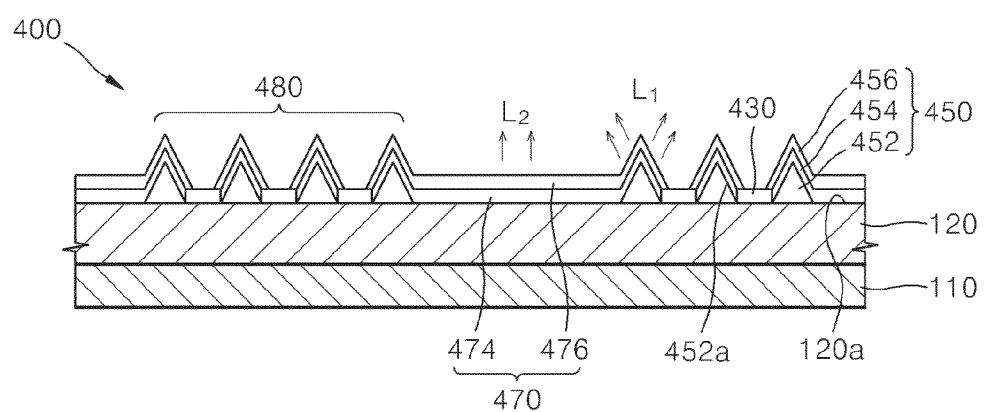
FIG. 10 is a cross-sectional view of a schematic structure of a light-emitting device according to another embodiment.

FIG. 10 is a cross-sectional view of a schematic structure of a light-emitting device 400 according to another embodiment.

The light-emitting device 400 includes a plurality of nanostructures 450 each including a first type semiconductor nano-core 452, an active layer 454, and a second type semiconductor layer 456, and at least one flat structure layer 470 including a flat-active layer 474 and a flat-second type semiconductor layer 476.

The plurality of nanostructures 450 are divided into a plurality of groups 480 including two or more adjacent nanostructures 450, and the flat structure layer 470 and the plurality of groups 480 are alternately disposed.

The flat-active layer 474 of the flat structure layer 470 is connected to the active layers 454 of the plurality of nanostructures 450 that are adjacent to one another with the flat structure layer 470 therebetween, and the active layers 454 of the nanostructures 450 of each of the groups 480 are separated from one another by a mask layer 430 to not be connected to one another.

Lights $L_1$ and $L_2$ having different wavelengths are emitted from the active layer 454 formed on an inclined plane 452a that is a semipolar plane and the flat-active layer 474 formed on a flat plane 120a that is a c-plane having polarity, respectively. The number of nanostructures 450 that constitute the groups 480 or a length of the flat structure layer 470 may be adjusted so that a desired multi-wavelength light may be emitted.

The second type semiconductor layers 256, 356, and 456 of the nanostructures 250, 350, and 450 of the light-emitting devices 200, 300, and 400 illustrated in FIGS. 8, 9, and 10 may use a semiconductor material that contains In, as illustrated in the light-emitting device 100 of FIG. 1. That is, the second type semiconductor layers 256, 356, and 456 may be doped with Mg that is a p-type impurity. In order to uniformly form the p-type semiconductor layer, the second type semiconductor layers 256, 356, and 456 may include $In_xGa_{1-x}N$ (where $0<x<1$), for example, $In_xGa_{1-x}N$ (where $0<x<0.1$). Alternatively, when the second type semiconductor layers 256, 356, and 456 are to have a higher band gap, the second type semiconductor layers 256, 356, and 456 may include $Al_xIn_yGa_{1-x-y}N$ (where $0<x<1$, $0<y<1$, $0<x+y<1$), for example, $Al_xIn_yGa_{1-x-y}N$ (where $0<x<1$, $0<y<0.1$, $0<x+y<1$). In addition, an $Al_xIn_yGa_{1-x-y}N$ layer (where $0<x<1$, $0<y<1$, $0<x+y<1$) may be further formed between the active layers 254, 354, and 454 and the second type semiconductor layers 256, 356, and 456 to act as an EBL or a CSL.

The light-emitting devices 100, 200, 300, and 400 described above include 3D nanostructures and involve a structure in which a p-type semiconductor layer may be uniformly formed at a top part of the nanostructures.

In the light-emitting devices 100, 200, 300, and 400 described above, leakage current is decreased, doping efficiency is improved, and the electrical resistances of the light-emitting devices 100, 200, 300, and 400 are decreased so that electrical performances thereof are improved. In addition, relatively low temperature growth may be performed, the quality of active layers during a process of manufacturing the light-emitting devices 100, 200, 300, and 400 is not degraded, and the internal quantum efficiency of the light-emitting devices 100, 200, 300, and 400 is improved.

FIGS. 11A through 11D are cross-sectional views illustrating a method of manufacturing a light-emitting device 100, according to an embodiment.

Figure 11A:
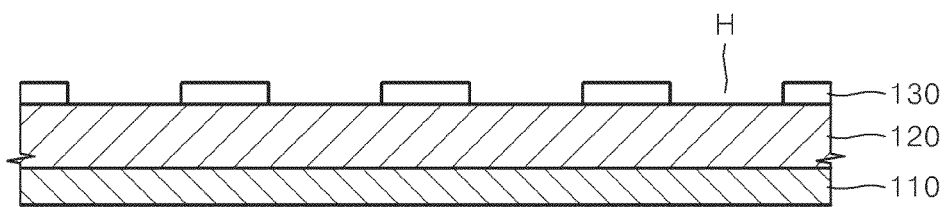
FIGS. 11A through 11D are cross-sectional views illustrating a method of manufacturing a light-emitting device, according to an embodiment.
Figure 11B:
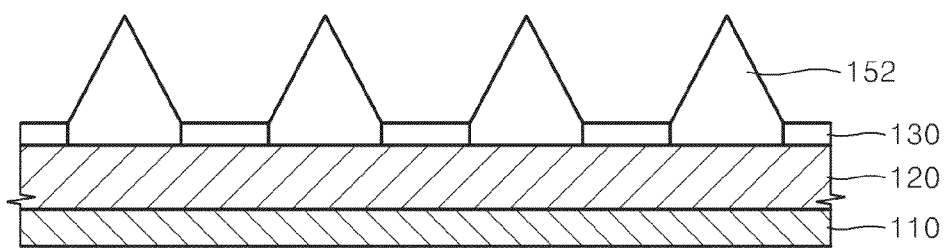
Figure 11C:
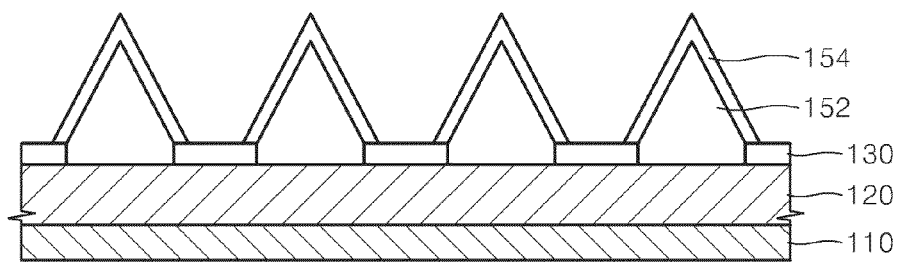
Figure 11D:
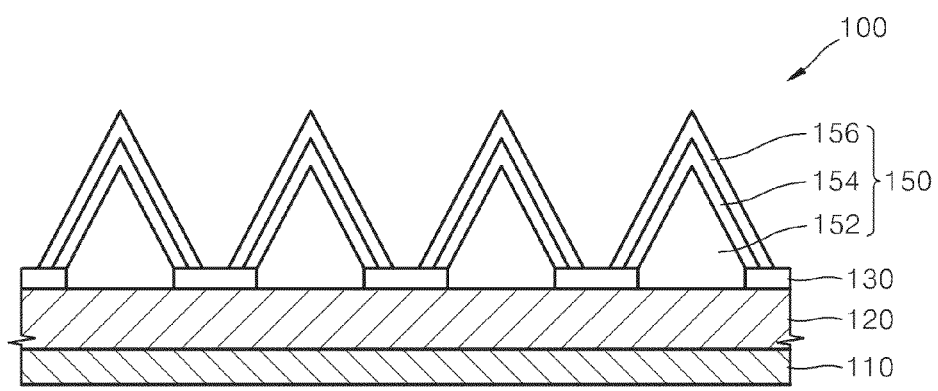

Referring to FIG. 11A, a first type semiconductor layer 120 is formed on a substrate 110, and a mask layer 130 having a plurality of nano-holes H formed therein is formed on the first type semiconductor layer 120. The mask layer 130 may be formed by forming a layer using an insulating material on the first type semiconductor layer 120 and etching the layer in a desired pattern of the nano-holes H by performing a lithography process. Referring to FIG. 11B, a first type semiconductor nano-core 152 is grown in a 3D shape through the plurality of nano-holes H. Referring to FIGS. 11C and 11D, an active layer 154 and a second type semiconductor layer 156 are sequentially grown on a surface of the first type semiconductor nano-core 152, thereby forming a plurality of nanostructures 150. The active layers 154 of the plurality of nanostructures 150 are not connected to one another. However, the present invention is not limited thereto, and the active layers 154 of the plurality of nanostructures 150 may be connected to one another.

Figure 12A:
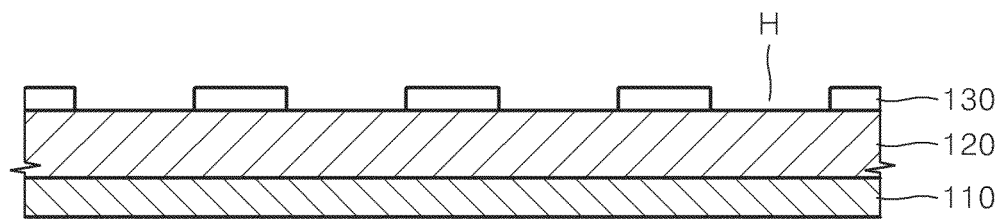
FIGS. 12A through 12D are cross-sectional views illustrating a method of manufacturing a light-emitting device, according to another embodiment.
Figure 12B:
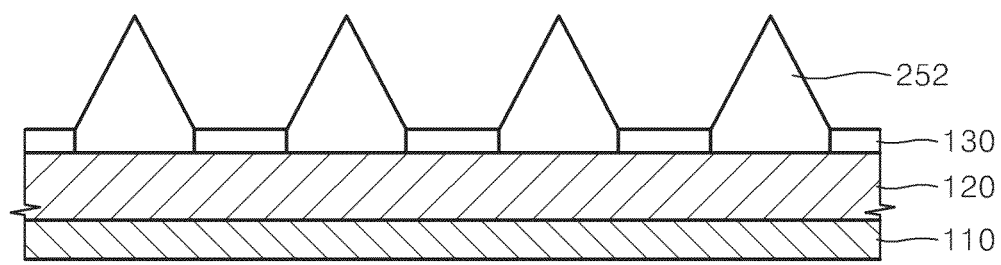
Figure 12C:
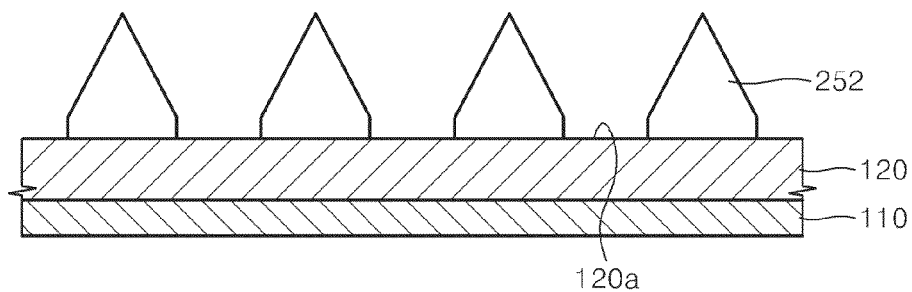
Figure 12D:
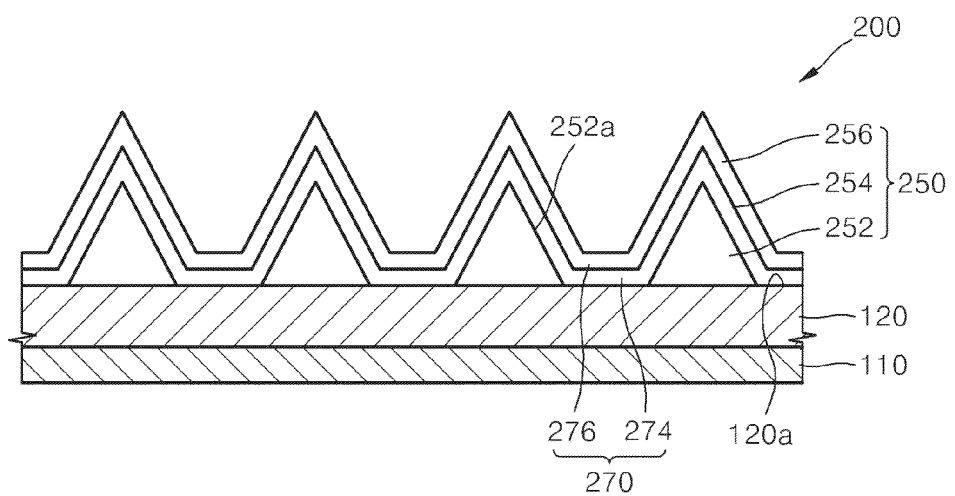

FIGS. 12A through 12D are cross-sectional views illustrating a method of manufacturing a light-emitting device 200, according to another embodiment. Referring to FIG. 12A, a first type semiconductor layer 120 is formed on a substrate 110, and a mask layer 130 having a plurality of nano-holes H formed therein is formed on the first type semiconductor layer 120. The mask layer 130 is formed by forming a layer using an insulating material on the first type semiconductor layer 120 and etching the layer in a desired pattern of the nano-holes H by performing a lithography process. Referring to FIG. 12B, a first type semiconductor nano-core 252 is grown in a 3D shape through the plurality of nano-holes H. Next, the mask layer 130 is etched to expose a flat plane 120a of the first type semiconductor layer 120, as illustrated in FIG. 12C. Next, layers that constitute a light-emitting structure are formed on the structure of FIG. 12C. That is, referring to FIG. 12D, an active layer 254 and a second type semiconductor layer 256 are sequentially grown on a surface of the first type semiconductor nano-core 252, and a flat-active layer 274 and a flat-second type semiconductor layer 276 are sequentially formed on the flat plane 120a. Lights $L_1$ and $L_2$ having different wavelengths are emitted from the active layer 254 formed on an inclined plane 252a that is a semipolar plane and the flat-active layer 274 formed on the flat plane 120a that is a polar plane, respectively.

In the method of manufacturing the light-emitting device 100 illustrated in FIGS. 11A through 11D and the method of manufacturing the light-emitting device 200 illustrated in FIGS. 12A through 12D described above, the second type semiconductor layers 156 and 256 are formed of a semiconductor material that contains In. Thus, the second type semiconductor layers 156 and 256 are uniformly formed as a top part of the nanostructures 150 and 250 with a 3D shape that constitutes the nanostructures 150 and 250. Thus, the light-emitting devices 100 and 200 are manufactured to have a small leakage current and an improved luminous efficiency.

While exemplary embodiments have been particularly shown and described, it will be understood by those of ordinary skill in the art that various changes in form and details may be made therein without departing from the spirit and scope of the inventive concept as defined by the following claims.

What is claimed is:

1. A light-emitting device comprising:
    a first type semiconductor layer;
    a plurality of nanostructures, each of the nanostructures comprising a first type semiconductor nano-core having a three-dimensional (3D) shape and disposed on the first type semiconductor layer, an active layer disposed to surround a surface of the first type semiconductor nano-core, and a second type semiconductor layer disposed to surround a surface of the active layer and comprising indium (In); and
    at least one flat structure layer comprising a flat-active layer and a flat-second type semiconductor layer that are sequentially disposed on the first type semiconductor layer parallel to the first type semiconductor layer,
    wherein the plurality of nanostructures are divided into a plurality of groups comprising two or more adjacent nanostructures, and the at least one flat structure layer and the plurality of groups are alternately disposed,
    wherein the nanostructure and the flat structure layer are configured to emit light of different wavelengths, and
    wherein a length of the flat structure is adjusted such that the light-emitting device emits white light or another type of multi-wavelength light.

2. The light-emitting device of claim 1, wherein the 3D shape is one of a cone shape, a pyramid shape, and a column shape.

3. The light-emitting device of claim 1, wherein the second type semiconductor layer is doped with magnesium (Mg) that is an impurity.

4. The light-emitting device of claim 1, wherein the second type semiconductor layer comprises $In_xGa_{1-x}N$ (where $0<x<1$).

5. The light-emitting device of claim 4, wherein the second type semiconductor layer comprises $In_xGa_{1-x}N$ (where $0<x<0.1$).

6. The light-emitting device of claim 1, wherein the second type semiconductor layer comprises $Al_xIn_yGa_{1-x-y}N$ (where $0<x<1$, $0<y<1$, $0<x+y<1$).

7. The light-emitting device of claim 6, wherein the second type semiconductor layer comprises $Al_xIn_yGa_{1-x-y}N$ (where $0<x<1$, $0<y<0.1$, $0<x+y<1$).

8. The light-emitting device of claim 1, further comprising an $Al_xIn_yGa_{1-x-y}N$ layer (where $0<x<1$, $0<y<1$, $0<x+y<1$) interposed between the active layer and the second type semiconductor layer.

9. The light-emitting device of claim 1, further comprising a mask layer disposed on the first type semiconductor layer and having a plurality of nano-holes formed therein, wherein the first type semiconductor nano-core of each of the plurality of nanostructures is grown through each of the plurality of nano-holes.

10. The light-emitting device of claim 1, wherein the active layers of the plurality of nanostructures and the flat-active layer of the at least one flat structure layer are connected to one another.

11. The light-emitting device of claim 1, wherein the flat-active layer of the at least one flat structure layer is connected to the active layers of the plurality of nanostructures that are adjacent to one another with the at least one flat structure layer between the groups of nanostructures.

12. The light-emitting device of claim 1, wherein the flat-active layer of the at least one flat structure layer is connected to the active layers of the plurality of nano-structures.

\* \* \* \* \*